United States Patent
Wang et al.

(10) Patent No.: US 8,908,426 B2
(45) Date of Patent: Dec. 9, 2014

(54) CELL SENSING CIRCUIT FOR PHASE CHANGE MEMORY AND METHODS THEREOF

(71) Applicant: Macronix International Co., Ltd., Hsin-chu (TW)

(72) Inventors: Tien-Yen Wang, Hsin-chu (TW); Chao-I Wu, Hsin-chu (TW); Chun-Hsiung Hung, Hsin-chu (TW)

(73) Assignee: Macronix International Co., Ltd. (TW)

( * ) Notice: Subject to any disclaimer, the term of this patent is extended or adjusted under 35 U.S.C. 154(b) by 84 days.

(21) Appl. No.: 13/693,816

(22) Filed: Dec. 4, 2012

(65) Prior Publication Data
US 2014/0153326 A1 Jun. 5, 2014

(51) Int. Cl.
*G11C 11/00* (2006.01)
*G11C 13/00* (2006.01)
*G11C 11/56* (2006.01)
*G11C 7/06* (2006.01)

(52) U.S. Cl.
CPC ............... *G11C 7/06* (2013.01); *G11C 13/004* (2013.01); *G11C 11/5678* (2013.01); *G11C 13/0004* (2013.01); *G11C 2013/0054* (2013.01)
USPC ........................ 365/163; 365/185.21; 365/207

(58) Field of Classification Search
USPC .................... 365/163, 207, 205, 185.21, 148
See application file for complete search history.

(56) References Cited

U.S. PATENT DOCUMENTS 7,535,783 B2 * 5/2009 DeBrosse et al. ............. 365/207
7,882,455 B2 * 2/2011 Habib et al. .................. 365/163

\* cited by examiner

*Primary Examiner* — David Lam
(74) *Attorney, Agent, or Firm* — Volpe and Koenig, P.C.

(57) ABSTRACT

A cell sensing circuit for a phase changing memory and methods thereof are provided. A specific one of the proposed methods includes: providing a sensing circuit having a sense amplifier, and two identical stable currents respectively received by a reference cell and a target cell; establishing a cell voltage on a cell side and a reference voltage on a reference side respectively via the two identical stable currents; and using the sense amplifier to determine a logic state of the target cell based on a voltage difference between the reference voltage and the cell voltage.

20 Claims, 12 Drawing Sheets

CELL SENSING CIRCUIT FOR PHASE CHANGE MEMORY AND METHODS THEREOF

FIELD OF THE INVENTION

The present invention relates to a cell sensing circuit for a phase change memory and methods thereof. More particularly, it relates to a method for sensing a phase change memory having a multi-level cell with plural cells.

BACKGROUND OF THE INVENTION

Sensing a phase change memory is always a challenge especially when the reference cell and the target cell of the phase change memory are both located at high resistance range. The traditional way of sensing a phase change memory is to provide a voltage to generate a cell current signal. When the target cell resistance and the reference resistance get higher, the cell current signals flowing through the target cell and the reference cell are too small to verify a voltage difference between the target cell and the reference cell.

The conventional method of developing a cell signal ($V_{cell}$) has the following sequence:

Providing a clamping voltage of $V_{Clamp}$ with any kind of pre-charge scheme for setting up a bit line voltage ($V_{BL}$);

Generating a cell current ($I_{cell}$), wherein $I_{cell}$ relates to a bitline voltage and a cell state, and the cell state is the resistance of phase change memory ($R_{PAR}+R_{cell}$), where $R_{PAR}$ is the parasitic resistance and $R_{cell}$ is the resistance of the cell;

Setting $I_{cell}=V_{BL}/(R_{PAR}+R_{cell})$; and

Figure 1:
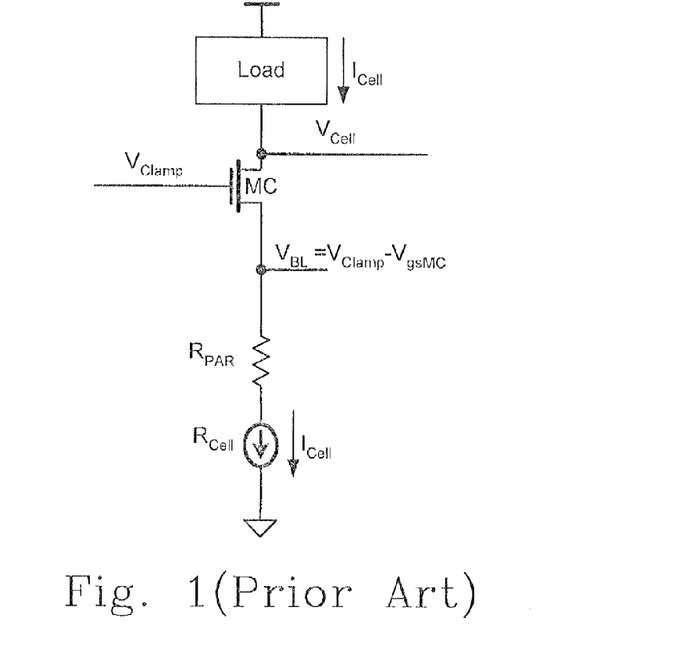
FIG. 1 is a schematic circuit diagram of a portion of a conventional sensing circuit on a target cell side for a phase change memory.

Developing a cell voltage $V_{Cell}$ for being provided to a sense amplifier, wherein $V_{Cell}=I_{Cell}*R_{Load}$, where $R_{Load}$ is the resistance of the load. This sequence can be accomplished by a circuit as shown in FIG. 1. FIG. 1 is a schematic circuit diagram of a portion of a conventional sensing circuit on a target cell side for a phase change memory. In FIG. 1, it includes a load having a resistance $R_{Load}$ with a first and a second terminals, a clamping switch MC with a first, a second and a control terminals, a parasitic resistor with a resistance $R_{PAR}$ and a cell resistor with a resistance $R_{cell}$, wherein the first terminal of the load receives a power voltage and the second terminal of the load is electrically connected to the first terminal of the clamping switch MC at a first node for outputting a cell voltage $V_{cell}$, the control terminal of the clamping switch receives a clamping voltage $V_{clamp}$, and the second terminal of the clamping switch MC is electrically connected to the first terminal of the parasitic resistor at a second node for providing a bitline voltage $V_{BL}$, wherein the clamping switch is a MOSFET MC with the first terminal being a drain, the second terminal being a source, and the control terminal being a gate, and $V_{BL}=V_{Clamp}-V_{gsMC}$, where $V_{gsMC}$ is the voltage difference between the gate and the source of the MOSFET MC.

Keeping the drawbacks of the prior arts in mind, and employing experiments and research full-heartily and persistently, the applicant finally conceived a cell sensing circuit for a phase change memory and methods thereof.

SUMMARY OF THE INVENTION

It is therefore an object of the present invention to provide a cell sensing circuit for a phase change memory and methods for sensing a phase change memory and for sensing a phase change memory having a multi-level cell with plural cells to determine a logic state of the target cell of the phase change memory and respective logic states of the multi-level cell with plural cells respectively, wherein relatively higher voltages are provided to a target cell and a reference cell of the phase change memory to provide two identical stable currents thereto for increasing the current signals of the target cell and the reference cell so as to overcome the problem of sensing the phase change memory that when both of the target cell and the reference cell are located at high resistance range, the respective current signals flowing through the target cell and the reference cell are too small to verify a voltage difference between the target cell and the reference cell.

According to the first aspect of the present invention, a cell sensing circuit for a phase change memory includes two current sources respectively generating two identical stable currents, wherein the phase change memory has a reference cell receiving one of the two identical stable currents to set up a reference voltage and a target cell receiving the other one of the two identical stable currents to set up a cell voltage, and the cell voltage is higher than a read voltage provided to the target cell, and a sense amplifier receiving the reference voltage and the cell voltage to determine a logic state of the target cell based on a voltage difference between the reference voltage and the cell voltage.

According to the second aspect of the present invention, a method for sensing a phase change memory includes: providing a sensing circuit having a sense amplifier, and two identical stable currents respectively received by a reference cell and a target cell of the phase change memory; establishing a cell voltage of the target cell and a reference voltage of the reference cell respectively via the two identical stable currents; and using the sense amplifier to determine a logic state of the target cell based on a voltage difference between the reference voltage and the cell voltage.

According to the third aspect of the present invention, a method for sensing a phase change memory having a multi-level cell with plural cells includes: providing plural reference states; setting up all the plural cells as unmarked; and sensing and comparing the unmarked plural cells with a specific one of the plural reference states from a lowest value of the plural reference states to a highest value of the plural reference states to obtain plural cell signals to determine respective logic states of the plural cells.

The present invention may best be understood through the following descriptions with reference to the accompanying drawings, in which:

BRIEF DESCRIPTION OF THE DRAWINGS

FIGS. 10(*a*)-10(*c*) show three respective reference cells in the chip for estimating the $V_{Clamp}$ voltage according to the tenth preferred embodiment of the present invention;

FIG. 10(*d*) shows a schematic diagram of 4 states of a MLC having plural cells according to the tenth preferred embodiment of the present invention;

FIG. 10(*e*) shows a schematic diagram of the 4 states and the steps included in the proposed method for sensing a phase change memory having a multi-level cell with plural cells according to the tenth preferred embodiment of the present invention.

DETAILED DESCRIPTION OF THE PREFERRED EMBODIMENT

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

The way to increase a current signal is to give a higher voltage which should be well controlled for preventing cell disturbance.

The present invention discloses a novel sensing scheme enhancing the sensing window. The idea is to provide two identical stable currents for a reference cell and a target cell. The two identical stable currents respectively establish a voltage level on a reference cell side and the other voltage level on a target cell side, and then a sense amplifier is used to determine a logic state of the target cell based on a voltage difference between the target cell and the reference cell.

This enhanced and wider window makes the multi-level cell sensing more practical, wherein the multi-level cell with plural cells usually involves higher resistance.

Figure 2:
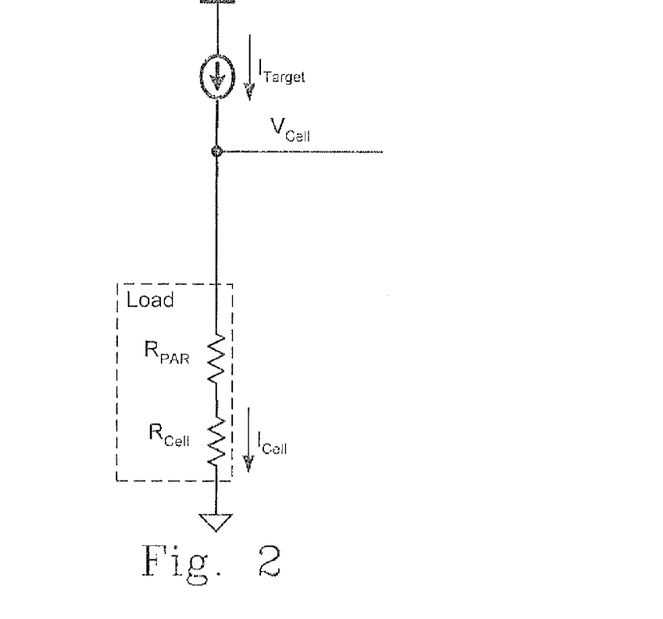
FIG. 2 is a circuit diagram showing a portion of a sensing circuit on a target cell side for a phase change memory according to the first preferred embodiment of the present invention.

FIG. 2 is a circuit diagram showing a portion of a sensing circuit on a target cell side for a phase change memory according to the first preferred embodiment of the present invention. In FIG. 2, it includes a current source generating one of two identical stable currents, $I_{Target}$, and having a first terminal receiving a power voltage and a second terminal electrically connected to a first node providing a cell voltage $V_{Cell}$, and electrically connected to a load with a parasitic resistor having a resistance $R_{PAR}$ and a cell resistor having a resistance $R_{cell}$ and electrically connected to the parasitic resistor in series, wherein the load has a first terminal electrically connected to the first node and a second terminal electrically connected to a ground, and a current $I_{cell}$ flows through the cell.

The cell signal developing procedure of the present invention is different from that of the prior art as shown in FIG. 1. The cell current $I_{Cell}$ is forced to a higher value. By doing this, the cell current $I_{Cell}$ will have a value higher than a read current flowing through the target cell for providing a read voltage to the target cell with a high resistance. The target current $I_{Target}$ is generated in a chip, and is transferred to the memory cell. With proper design, the $I_{Cell}$ is equal to $I_{Target}$, i.e. $I_{Target}=I_{Cell}$. The target cell is acting as a load, and $V_{Cell}$ is generated according to the following equation $V_{Cell}=I_{Target}*(R_{PAR}+R_{Cell})$.

Figure 3:
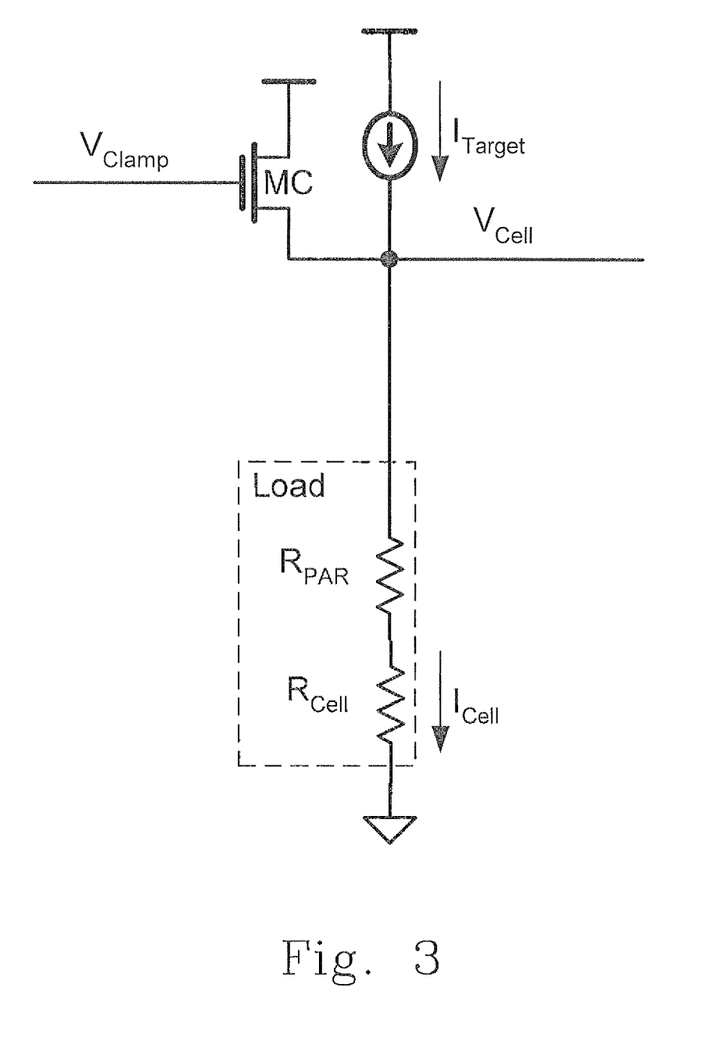
FIG. 3 is a circuit diagram showing a portion of a sensing circuit on a target cell side for a phase change memory according to the second preferred embodiment of the present invention.
Figure 4A:
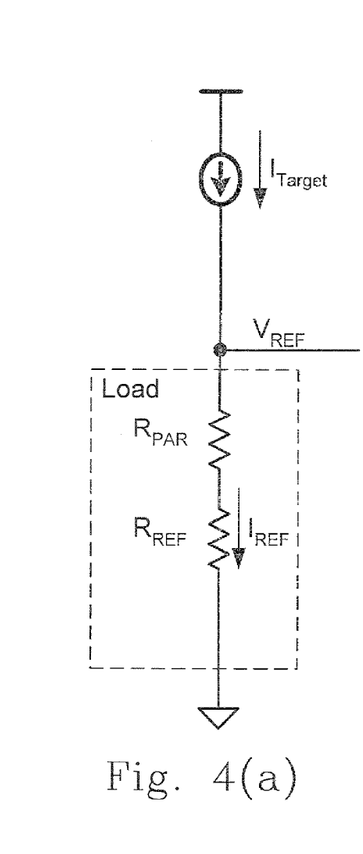
FIG. 4(a) is a circuit diagram showing a portion of a sensing circuit on a reference cell side for a phase change memory according to the first preferred embodiment of the present invention.
Figure 4B:
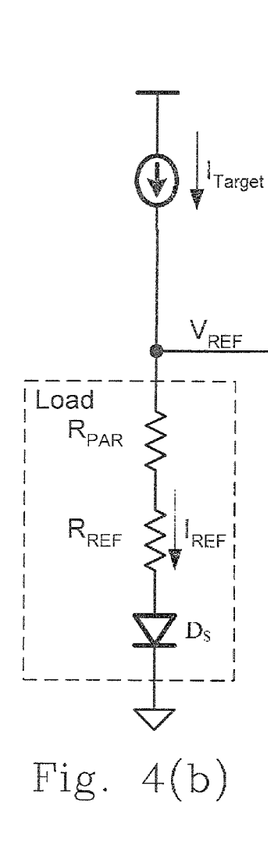
FIGS. 4(b)-4(d) are respectively a circuit diagram showing a portion of a sensing circuit on a reference cell side for a phase change memory according to the third to the fifth preferred embodiments of the present invention.
Figure 4C:
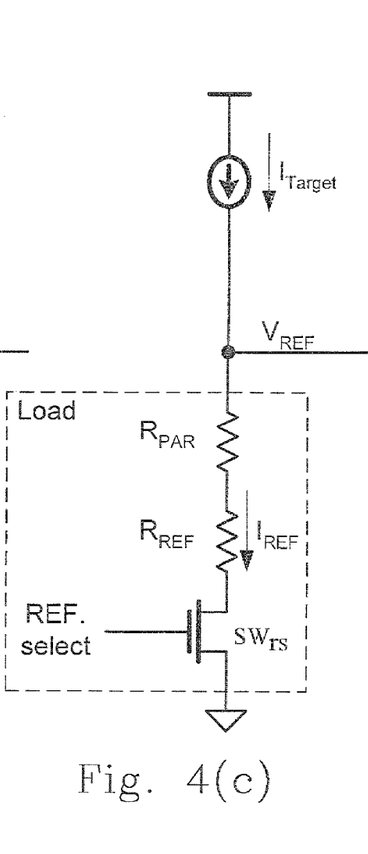
Figure 4D:
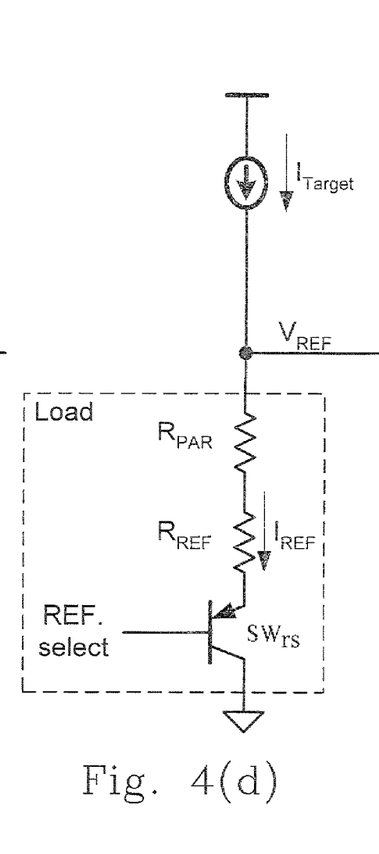

FIG. 3 is a circuit diagram showing a portion of a sensing circuit on a target cell side for a phase change memory according to the second preferred embodiment of the present invention. In FIG. 3, the sensing circuit includes a pre-charge circuit and a current source. The pre-charge circuit has a clamping switch MC with a drain receiving a power voltage, a source and a gate receiving a clamping voltage $V_{Clamp}$. The current source generates one of two identical stable currents, $I_{Target}$, and has a first terminal receiving the power voltage, and a second terminal electrically connected to a first node providing a cell voltage $V_{Cell}$, and electrically connected to the source of the switch MC. The target cell has a load with a parasitic resistor having a resistance $R_{PAR}$, and a cell resistor having a resistance $R_{cell}$ and electrically connected to the parasitic resistor in series, wherein the load has a first terminal electrically connected to the first node and a second terminal electrically connected to a ground, and a current $I_{cell}$ flows through the target cell.

In FIG. 3, it's going to be a slow process if $V_{Cell}$ is only established by $I_{Target}$. To enhance the $V_{Cell}$ developing speed, a pre-charge circuit of the switch MC is employed. Higher $V_{Clamp}$ generates disturbance to the target cell so that the $V_{Clamp}$ could generate in a chip by another reference cell in the chip. The pre-charge circuit of the switch MC is turned off after $V_{Cell}$ is pre-charged to a certain level, and then $I_{Target}$ accomplishes the $V_{Cell}$ developing process.

FIG. 4(*a*) is a circuit diagram showing a portion of a sensing circuit on a reference cell side for a phase change memory according to the first preferred embodiment of the present invention. In FIG. 4(*a*), it includes a current source generating one of two identical stable currents, $I_{Target}$, and having a first terminal receiving a power voltage and a second terminal electrically connected to a second node providing a reference voltage $V_{REF}$, and electrically connected to a load with a parasitic resistor having a resistance $R_{PAR}$, and a reference cell resistor having a resistance $R_{REF}$ and electrically connected to the parasitic resistor in series, wherein the load has a first terminal electrically connected to the second node and a second terminal electrically connected to a ground, and a current $I_{REF}$ flows through the reference cell.

FIGS. 4(*b*)-4(*d*) are respectively a circuit diagram showing a portion of a sensing circuit on a reference cell side for a phase change memory according to the third to the fifth preferred embodiments of the present invention. The difference between each of FIGS. 4(*b*)-4(*d*) and FIG. 4(*a*) is that there is a selecting device electrically connected between the second terminal of the load and the ground for better signal tracking. The selecting device could be either a diode (e.g. diode Ds, see FIG. 4(*b*)), a MOSFET (e.g. switch SWrs receiving a control signal of REF. select, see FIG. 4(c)), or a BJT (e.g. switch SWrs receiving a control signal of REF. select, see FIG. 4(d)).

Similarly, a portion of a sensing circuit on a target cell side for a phase change memory as shown in FIGS. 2 and 3 could also further include a selecting device electrically connected between the second terminal of the load and the ground for better signal tracking and being a diode, a MOSFET, or a BJT.

Figure 5:
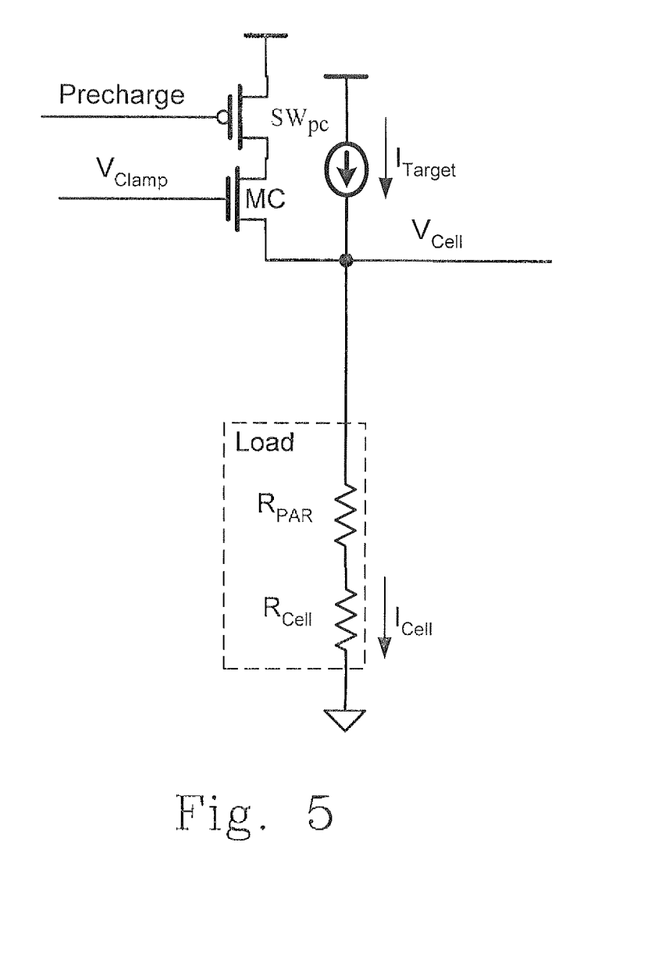
FIG. 5 is a circuit diagram showing a portion of a sensing circuit on a target cell side for a phase change memory according to the sixth preferred embodiment of the present invention.

FIG. 5 is a circuit diagram showing a portion of a sensing circuit on a target cell side for a phase change memory according to the sixth preferred embodiment of the present invention. The difference between FIG. 5 and FIG. 3 is that the pre-charge circuit of FIG. 5 is different from that of FIG. 3. In FIG. 5, there is an extra switch SWpc having a gate receiving a Precharge signal, a drain receiving a power voltage and a source electrically connected to the drain of the switch MC. FIG. 5 shows an example for enabling/disabling a pre-charge process. The Precharge signal only remains on for certain amount of time for enhancing the signal setup of $V_{Cell}$ and then is turned off. The difference between $I_{Target}$ (i.e. $I_{REF}$) and $I_{Cell}$ moving $V_{Cell}$ up or down to get the final cell signal.

Figure 6:
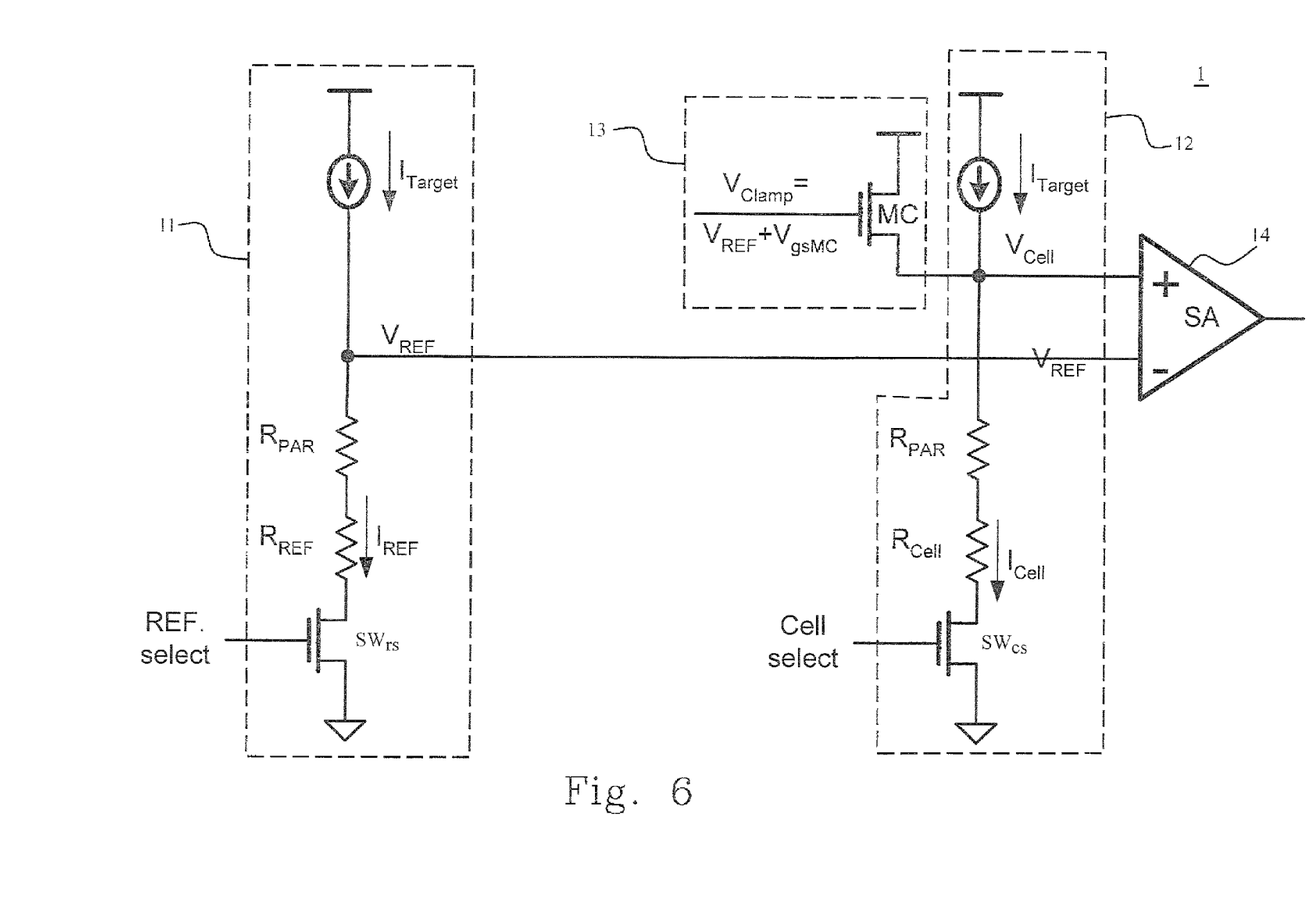
FIG. 6 is a circuit diagram of a sensing circuit for a phase change memory according to the fourth preferred embodiment of the present invention.

FIG. 6 is a circuit diagram of a sensing circuit for a phase change memory according to the fourth preferred embodiment of the present invention. In FIG. 6, the phase change memory and the sensing circuit 1 includes a portion of the sensing circuit on a reference cell side 11, a portion of the sensing circuit on a target cell side 12, a pre-charge circuit 13 and a sense amplifier 14, and provides two identical stable currents $I_{Target}$ which are adjustable. The sensing circuit establishes $V_{REF}$ on the reference cell side, and also establishes another voltage $V_{Cell}$ on the target cell side. A clamping voltage $V_{Clamp}$ (=$V_{REF}$+$V_{gsMC}$) is employed to reduce the setup time of $V_{Cell}$, where $V_{gsMC}$ is the voltage from the gate to the source of the switch MC. The sense amplifier 14, which could be a differential comparator or a latch, is used to determine a logic state of the target cell based on a voltage difference between the cell voltage $V_{Cell}$ and the reference voltage $V_{REF}$. The portion of the sensing circuit on the reference cell side 11 of FIG. 6 is the same as FIG. 4(c), and the differences between the portion of the sensing circuit on the target cell side 12 and the pre-charge circuit 13 of FIG. 6 and FIG. 3 are that there is a selecting device SWcs receiving a control signal of Cell select and electrically connected between the second terminal of the load and the ground, and Vclamp=$V_{REF}$+$V_{gsMC}$.

Figure 7:
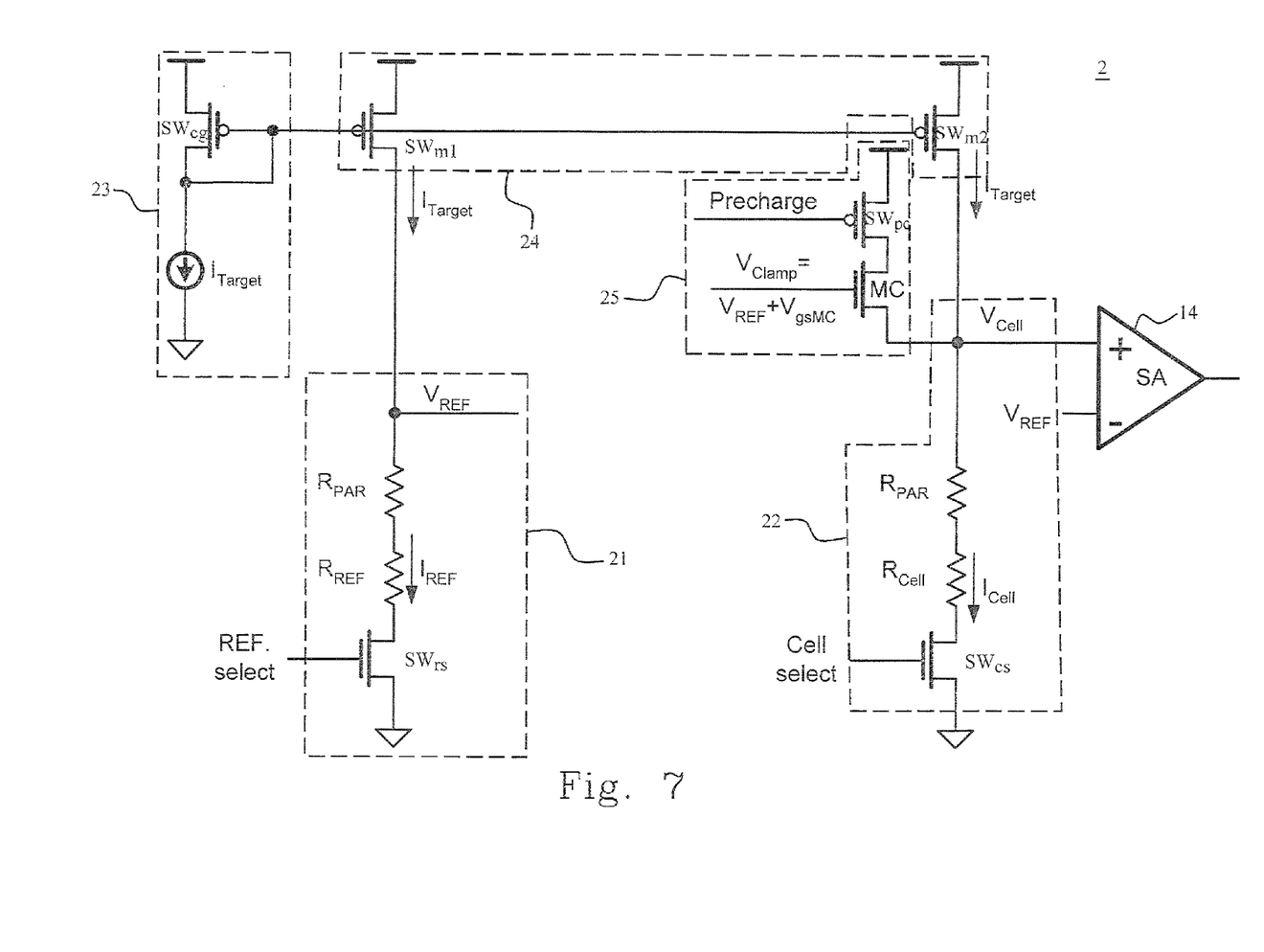
FIG. 7 is a circuit diagram of a sensing circuit for a phase change memory according to the seventh preferred embodiment of the present invention.

FIG. 7 is a circuit diagram of a sensing circuit for a phase change memory according to the seventh preferred embodiment of the present invention. In FIG. 7, the phase change memory and the sensing circuit 2 includes a portion of the sensing circuit on a reference cell side 21, a portion of the sensing circuit on a target cell side 22, a stable current generating circuit 23, a mirror circuit 24, a pre-charge circuit 25 and a sense amplifier 14. The portion of the sensing circuit on the reference cell side 21 is almost the same as the portion of the sensing circuit on the reference cell side 11 of FIG. 6 except that the current source generating $I_{Target}$ is omitted. The portion of the sensing circuit on the target cell side 22 is almost the same as the portion of the sensing circuit on the target cell side 12 of FIG. 6 except that the other current source generating $I_{Target}$ is also omitted. $I_{Target}$ is generated somewhere in a chip and mirrored to the reference cell and the target cell in a memory area. For the reference cell, it's going to be $I_{REF}$=$I_{Target}$, and also this $I_{Target}$ generates a reference voltage $V_{REF}$ for sense amplifier (SA) 14. On the target cell side of SA 14, $I_{Target}$ generates a cell voltage $V_{Cell}$, $V_{Cell}$ was pre-charged by a clamping voltage, and then the pre-charge circuit is turned off to let $I_{Target}$ finish the $V_{Cell}$ developing process. The stable current generating circuit 23 includes a switch SWcg having a drain receiving a power voltage, a source electrically connected to a current source generating a stable current of $I_{Target}$ and a gate electrically connected to the source. The mirror circuit 24 includes a first mirror switch SWm1 and a second mirror switch SWm2, each of which has a drain, a source and a gate. The drain of the first mirror switch SWm1 receives a power voltage, the source of the first mirror switch SWm1 is electrically connected to a second node of the portion of the sensing circuit on the reference cell side 21 for outputting the reference voltage $V_{REF}$ and the gate of the first mirror switch SWm1 is electrically connected to the gate of the switch SWcg and the gate of the second mirror switch SWm2. The drain of the second mirror switch SWm2 receives a power voltage, and the source of the second mirror switch SWm2 is electrically connected to a first node of the portion of the sensing circuit on the target cell side 22 for outputting the cell voltage $V_{Cell}$. The pre-charge circuit 25 is the same as that of FIG. 5 except that the clamping voltage Vclamp=$V_{REF}$+$V_{gsMC}$. The sense amplifier 14 is the same as that of FIG. 6. The logic state of the target cell is found by comparing the voltage difference of $V_{REF}$ and $V_{Cell}$.

Figure 8:
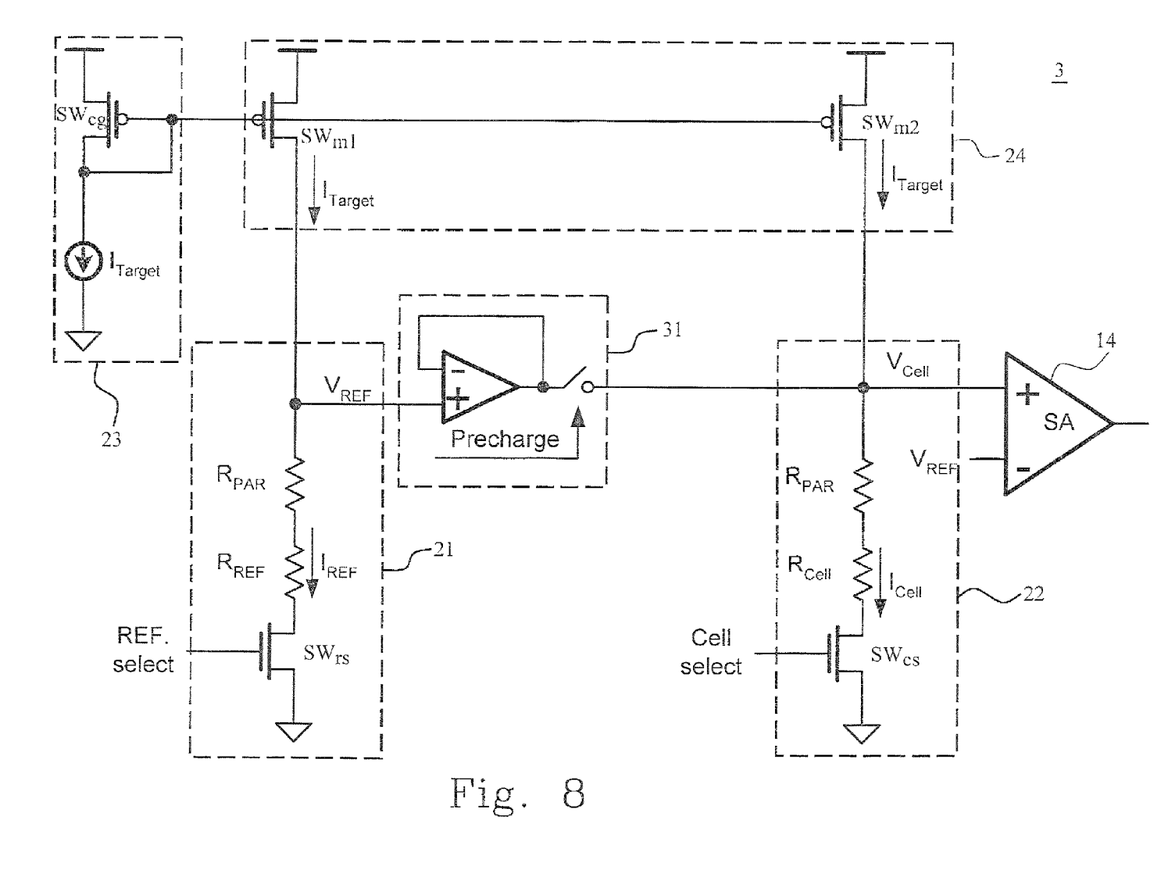
FIG. 8 is a circuit diagram of a sensing circuit for a phase change memory according to the eighth preferred embodiment of the present invention.

FIG. 8 is a circuit diagram of a sensing circuit for a phase change memory according to the eighth preferred embodiment of the present invention. In FIG. 8, the phase change memory and the sensing circuit 3 includes a portion of the sensing circuit on a reference cell side 21, a portion of the sensing circuit on a target cell side 22, a stable current generating circuit 23, a mirror circuit 24, a pre-charge circuit 31 and a sense amplifier 14. The difference between FIG. 8 and FIG. 7 is that the pre-charge circuit 25 is replaced by the pre-charge circuit 31. The pre-charge circuit 31 includes a unit gain buffer and a switch. When $V_{Cell}$ is precharged, $V_{REF}$ passes to $V_{Cell}$ via the unit gain buffer and the switch. Once the precharge ends, the $I_{REF}$ (i.e. $I_{Target}$) and $I_{Cell}$ accomplish the final $V_{Cell}$ developing process.

The mirror circuit 24 as shown in FIGS. 7 and 8 can be replaced by any kind of mirror circuit, such as a cascode current mirror, to cause the respective target currents $I_{Target}$ flowing through the reference cell side and the target cell side identical.

Figure 9:
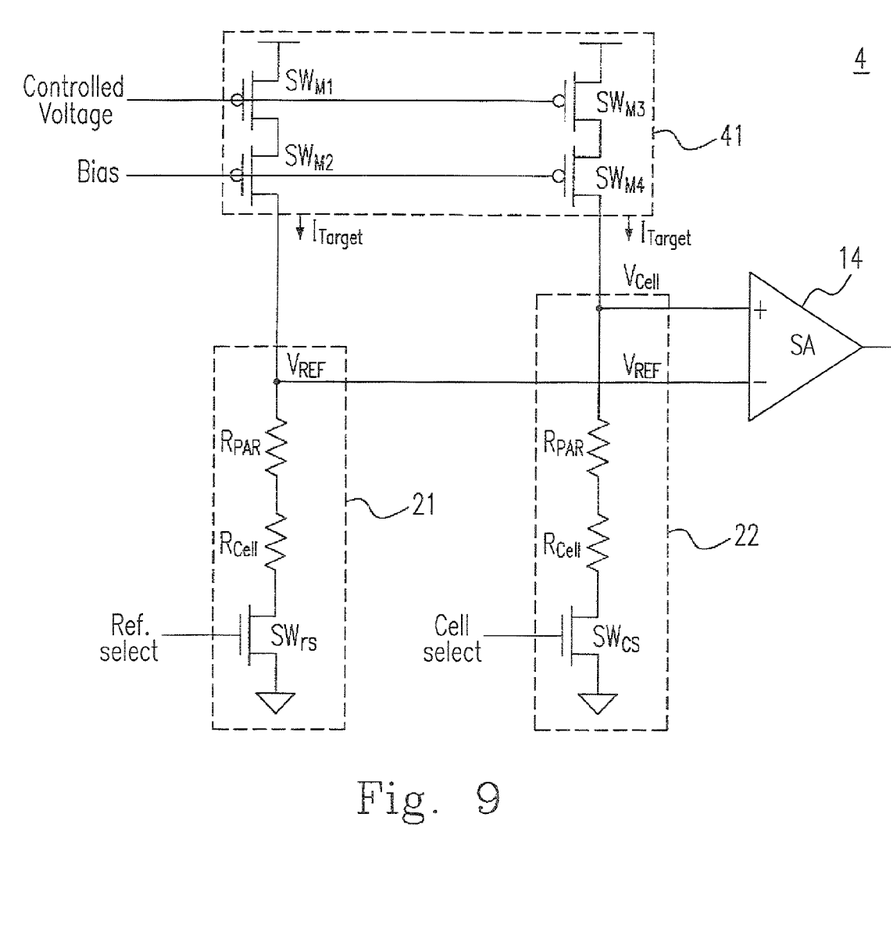
FIG. 9 is a circuit diagram of a sensing circuit for a phase change memory according to the ninth preferred embodiment of the present invention.

FIG. 9 is a circuit diagram of a sensing circuit for a phase change memory according to the ninth preferred embodiment of the present invention. In FIG. 9, the phase change memory and the sensing circuit 4 includes a portion of the sensing circuit on a reference cell side 21, a portion of the sensing circuit on a target cell side 22, a cascode current mirror 41 and a sense amplifier 14. The differences between FIG. 9 and FIG. 8 are that the stable current generating circuit 23 and the pre-charge circuit 41 are omitted, and the mirror circuit 24 is replaced by the cascode current mirror 41. The cascode current mirror 41 has four mirror switches $S_{WM1}$-$S_{WM4}$. Each of the four mirror switches has a drain, a source and a gate. The drain of the switch $S_{WM1}$ receives a power voltage, the gate of the switch $S_{WM1}$ receives a controlled voltage and is electrically connected to the gate of the switch $S_{WM3}$, the drain of the switch $S_{WM2}$ is electrically connected to the source of the switch $S_{WM1}$, the gate of the switch $S_{WM2}$ receives a bias and is electrically connected to the gate of the switch $S_{WM4}$, and the source of the switch $S_{WM2}$ outputs one of the two identical stable currents, $I_{Target}$, and is electrically connected to a second node of the portion of the sensing circuit on the reference cell side 21 for outputting the reference voltage $V_{REF}$. The drain of the switch $S_{WM3}$ receives a power voltage, the drain of the switch $S_{WM4}$ is electrically connected to the source of the switch $S_{WM3}$, and the source of the switch $S_{WM4}$ outputs the other one of the two identical stable currents, $I_{Target}$, and is electrically connected to a first node of the portion of the sensing circuit on the target cell side 22 for outputting the cell voltage $V_{Cell}$.

Figures 10A, 10B, 10C:
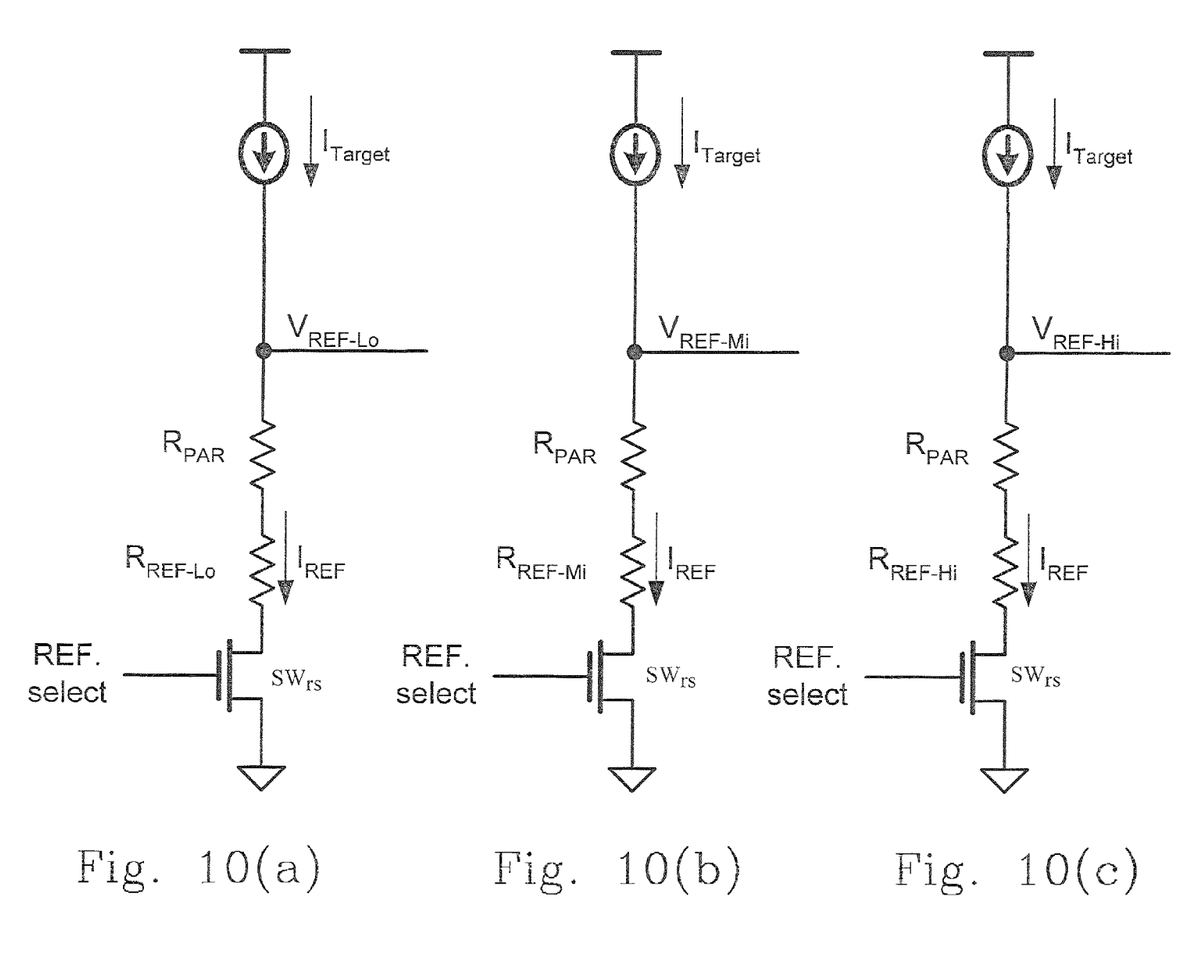
Figure 10D:
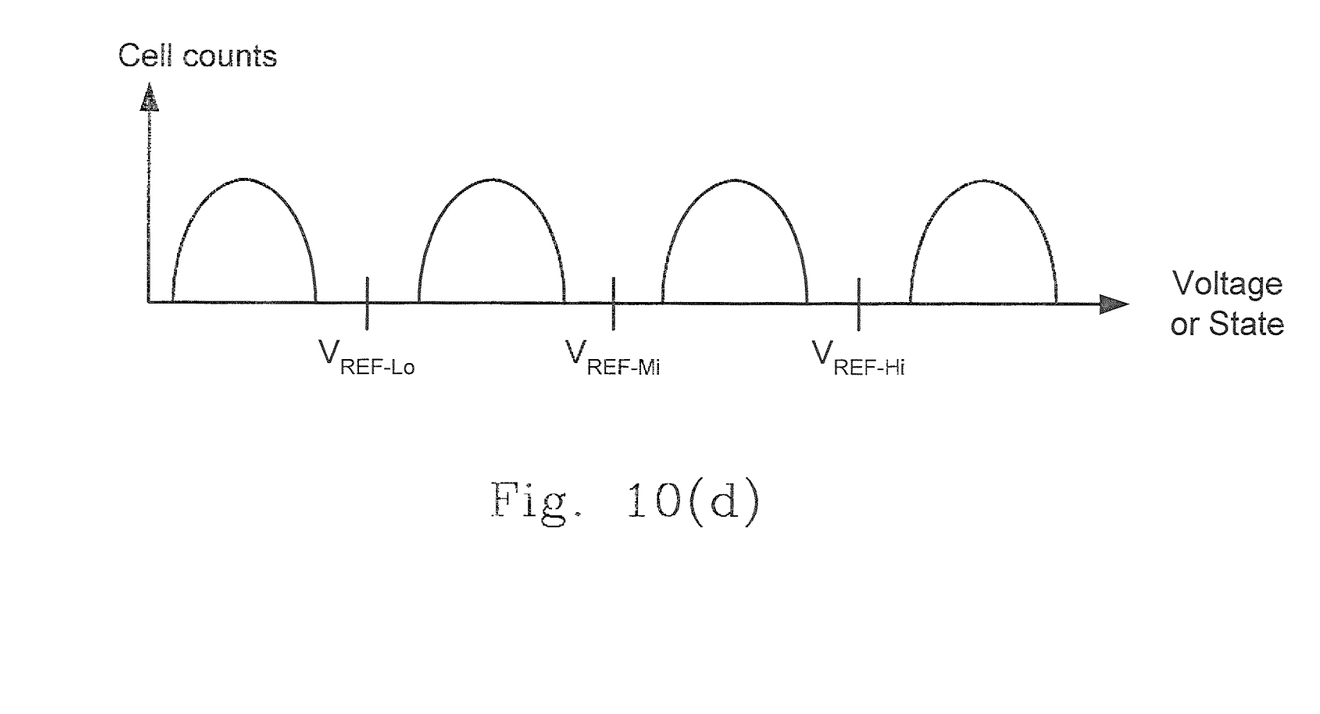

FIGS. 10(*a*)-10(*c*) show three respective reference cells in a chip for estimating the $V_{Clamp}$ voltage according to the tenth preferred embodiment of the present invention. For multi-level cell (MLC) applications, FIG. 10(*d*) shows a schematic diagram of 4 states of a MLC having plural cells according to the tenth preferred embodiment of the present invention as an example. In this example, $V_{Clamp-Lo}$, $V_{Clamp-Mi}$ and $V_{Clamp-Hi}$ relate to $V_{REF-Lo}$, $V_{REF-Hi}$ and $V_{REF-Hi}$ respectively. For phase change memory, cells with a higher resistance have a higher tolerance to the disturbance generating from higher bitline voltage. To minimize the disturbance, the cells are sensed from $V_{REF-Lo}$ to $V_{REF-Hi}$, once determined that the cell resistance is lower than the reference resistance (or the cell voltage is lower than the reference voltage), the cell is flagged.

Figure 10E:
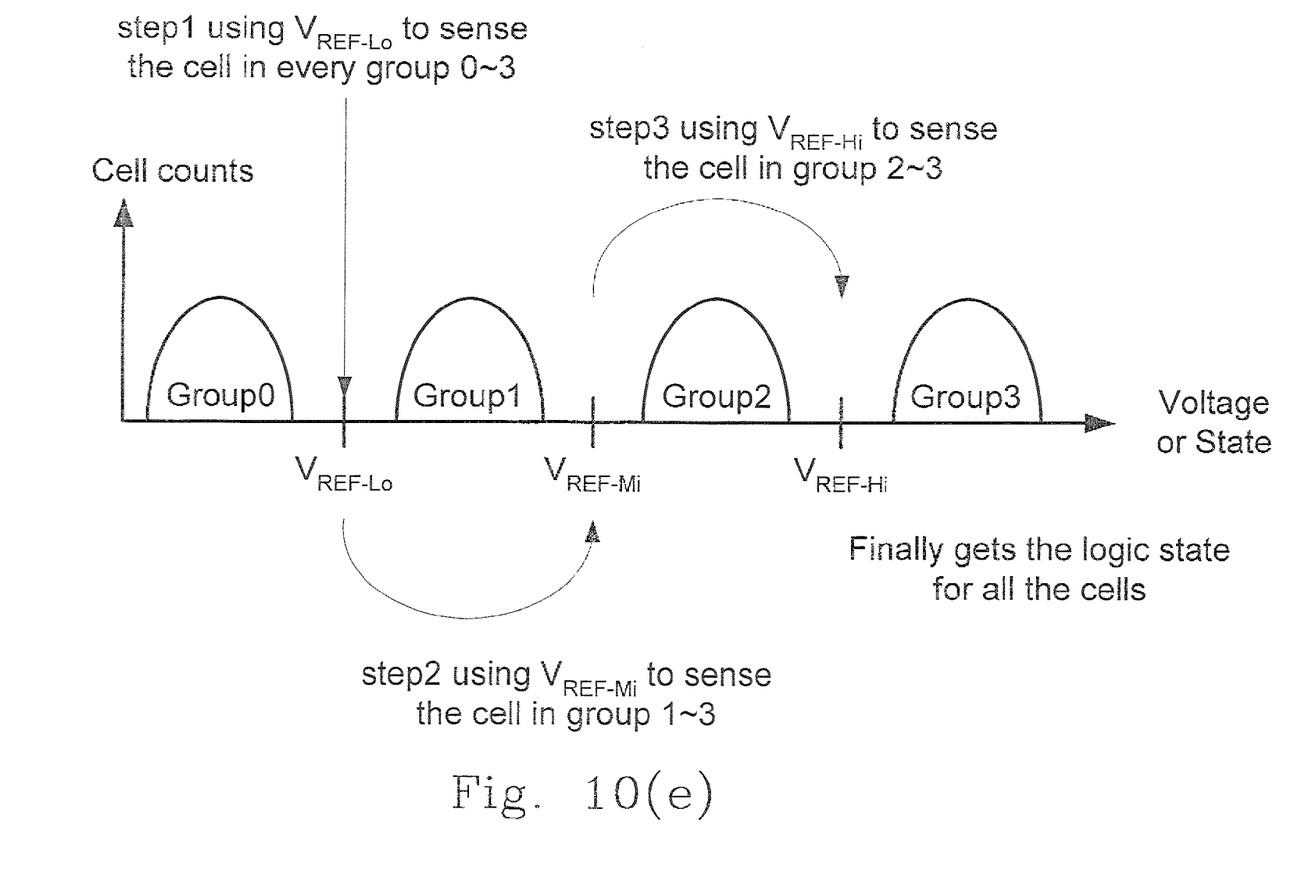

For example, if the reference voltage is $V_{REF-Lo}$, for each of the cells having been determined to possess a resistance lower than $R_{REF-Lo}$ is not going to be read again with $R_{REF-Mi}$. FIG. 10(*e*) shows a schematic diagram of the 4 states and steps included in the above-mentioned method for sensing a phase change memory having a multi-level cell with plural cells according to the tenth preferred embodiment of the present invention. In FIG. 10(*e*), the proposed method includes step 1: using $V_{REF-Lo}$ to sense the cell in every group 0-3; step 2: using $V_{REF-Mi}$ to sense the cell in every group 1-3; step 3: using $V_{REF-Hi}$ to sense the cell in every group 2-3; and step 4: getting a logic state for each of the cells.

Figure 11:
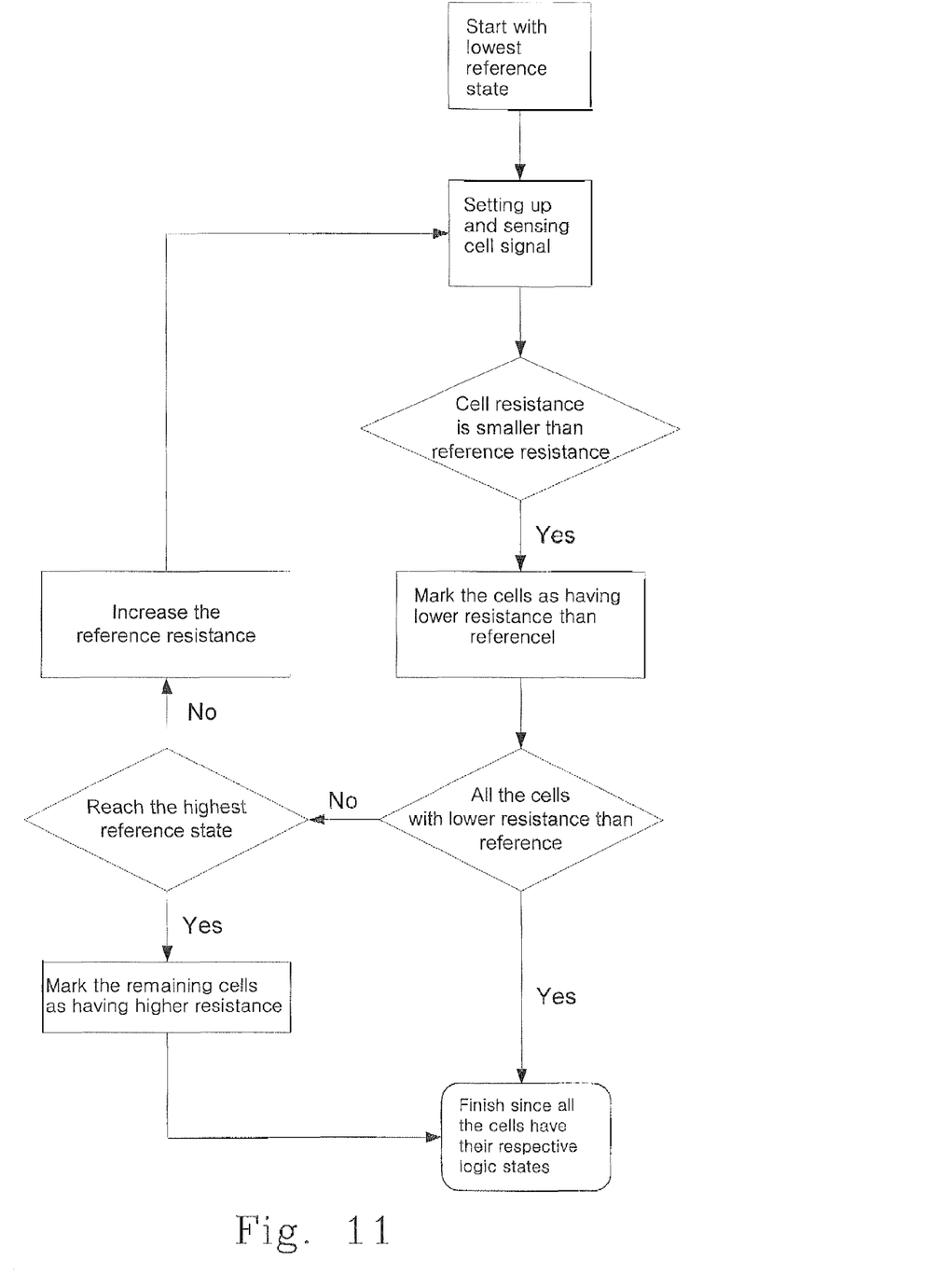
FIG. 11 is a flow chart of the proposed method for sensing a phase change memory having a multi-level cell with plural cells according to the eleventh embodiment of the present invention.

FIG. 11 is a flow chart of the proposed method for sensing a phase change memory having a multi-level cell with plural cells according to the eleventh embodiment of the present invention. There is a trade-off between cell signal and disturbance. Higher voltage provides higher cell signal and higher disturbance also. Therefore, the MLC sensing has to follow the steps included in the flow chart as shown in FIG. 11. In FIG. 11, the flow chart includes the steps of: starting with the lowest reference state; setting up and sensing the cell signal; if the cell resistance is smaller than the reference resistance, then marking the cells as having lower resistance than the reference resistance; if all the cells are with lower resistance than the reference resistance, then finishing the method since all the cells have their respective logic states; if all the cells are not with lower resistance than the reference resistance, then checking whether the highest reference state is reached; if the highest reference state is not reached, then increasing the reference resistance; and if the highest reference state is reached, then marking the remaining cells as having higher resistance. The main idea of preventing disturbance is to sense the cell with bitline voltage from low to high. Once a cell has been verified that its resistance is lower than the current reference state, the cell gets flagged and is prevented to be pre-charged or sensed again with next higher bit line voltage.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A cell sensing circuit for a phase change memory, comprising:

two current sources respectively generating two identical stable currents, wherein the phase change memory has a reference cell receiving one of the two identical stable currents to set up a reference voltage and a target cell receiving the other one of the two identical stable currents to set up a cell voltage, and the cell voltage is higher than a read voltage provided to the target cell; and A sense amplifier receiving the reference voltage and the cell voltage to determine a logic state of the target cell based on a voltage difference between the reference voltage and the cell voltage.

2. A cell sensing circuit according to claim 1, wherein the read voltage is provided to the target cell by a read current flowing through the target cell, the sense amplifier is one of a differential comparator and a latch, the reference cell is located on a reference cell side, and the target cell is located on a target cell side.

3. A cell sensing circuit according to claim 1, wherein the target cell and the reference cell are memory cells, are identical, both act as a load and have a load resistance being a sum of a parasitic resistance and a cell resistance, the cell voltage equals to a value of the other one of the two identical stable currents multiplied by the load resistance, and the reference voltage equals to a value of the one of the two identical stable currents multiplied by the load resistance.

4. A cell sensing circuit according to claim 3, wherein the cell voltage is outputted at a first node electrically connected to the target cell and one of the two current sources, the two current sources are located in a chip, the two identical stable currents are generated in the chip and transferred to the target cell and the reference cell respectively, and a current flowing through the target cell is equal to the one of the two identical stable currents.

5. A cell sensing circuit according to claim 4 further comprising a pre-charge circuit electrically connected to the first node and providing a clamping voltage thereto, wherein the pre-charge circuit pre-charges the cell voltage for a period of time until the cell voltage reaches a predetermined level, and then turns off, and the other one of the two identical stable currents accomplishes a developing process of the cell voltage.

6. A cell sensing circuit according to claim 5 further comprising a first and a second selecting devices for a better signal tracking, wherein the clamping voltage is generated in the chip by another reference cell and provided to the pre-charge circuit, the reference voltage is outputted at a second node connected between the reference cell and the other one of the two current sources, the first selecting device is connected between the target cell and a ground, the second selecting device is connected between the reference cell and the ground, and each of the first and the second selecting devices is one selected from a group consisting of a MOSFET, a diode, and a BJT.

7. A cell sensing circuit according to claim 6 further comprising a stable current generating circuit, a mirror circuit and a pre-charge circuit, wherein the stable current generating circuit generates a third identical stable current having a value equal to those of the two identical stable currents and includes a current generating switch with a first terminal receiving a power voltage, a second terminal connected to one of the two current sources, and a control terminal connected to the second terminal thereof, the mirror circuit mirrors the third identical stable current to the target cell and the reference cell, and has a first mirror switch with a first terminal receiving the power voltage, a second terminal outputting one of the two identical stable currents and a control terminal connected to the control terminal of the current generating switch, and a second mirror switch with a first terminal receiving the power voltage, a second terminal outputting the other one of the two identical stable currents and a control terminal connected to the control terminal of the first mirror switch, and the pre-charge circuit has a unit gain buffer having a non-inverting terminal connected to the second node, an inverting terminal and an output terminal connected to the inverting terminal, and a pre-charge switch having a first terminal connected to the output terminal of the unit gain buffer and a second terminal connected to the first node.

8. A cell sensing circuit according to claim 6 further comprising a mirror circuit mirroring a third identical stable current generated in a chip and having a value equal to that of the two identical stable currents to the target cell and the reference cell.

9. A cell sensing circuit according to claim 8, wherein the mirror circuit is a cascode current mirror.

10. A cell sensing circuit according to claim 5, wherein the pre-charge circuit is a clamping switch having a first terminal receiving a power voltage, a second terminal connected to the first node and outputting the clamping voltage, and a control terminal receiving a control signal to turn on/off the clamping switch.

11. A cell sensing circuit according to claim 5, wherein the pre-charge circuit includes a pre-charge switch having a first terminal receiving a power voltage, a second terminal and a control terminal receiving a first control signal to enable/disable a pre-charge process, and a clamping switch having a first terminal connected to the second terminal of the pre-charge switch, a second terminal connected to the first node and outputting the clamping voltage and a control terminal receiving a second control signal to turn on/off the clamping switch.

12. A cell sensing circuit according to claim 5 further comprising a stable current generating circuit generating a third identical stable current having a value equal to that of the two identical stable currents, and including a current generating switch with a first terminal receiving a power voltage, a second terminal connected to one of the two current sources and a control terminal connected to the second terminal thereof, and a mirror circuit mirroring the third identical stable current to the target cell and the reference cell, and having a first mirror switch with a first terminal receiving the power voltage, a second terminal outputting one of the two identical stable currents and a control terminal connected to the control terminal of the current generating switch, and a second mirror switch with a first terminal receiving the power voltage, a second terminal outputting the other one of the two identical stable currents and a control terminal connected to the control terminal of the first mirror switch.

13. A method for sensing a phase change memory, comprising:
providing a sensing circuit having a sense amplifier, and two identical stable currents respectively received by a reference cell and a target cell of the phase change memory;
establishing a cell voltage of the target cell and a reference voltage of the reference cell respectively via the two identical stable currents; and
using the sense amplifier to determine a logic state of the target cell based on a voltage difference between the reference voltage and the cell voltage.

14. A method according to claim 13, wherein the sensing circuit further comprises two current sources generating the two identical stable currents respectively and a mirror circuit mirroring a third identical stable current supplied from an external chip and having a value equal to that of the two identical stable currents to the target cell and the reference cell to be the two identical stable currents.

15. A method according to claim 13, wherein the sensing circuit further comprises a pre-charge circuit, further comprising a step of pre-charging the cell voltage by the pre-charge circuit for a period of time until the cell voltage reaches a predetermined level, then turning off the pre-charge circuit, and allowing a specific one of the two identical stable currents to accomplish the pre-charge of the cell voltage.

16. A method according to claim 13, wherein both the cell voltage and the reference voltage have a relatively higher value being larger than that of a read voltage provided to the target cell by a read current flowing through the target cell and being limited under a predetermined value by the two identical stable currents.

17. A method for sensing a phase change memory having a multi-level cell with plural cells, comprising:
providing plural reference states;
setting up all the plural cells as unmarked; and
sensing and comparing the unmarked plural cells with a specific one of the plural reference states from a lowest value of the plural reference states to a highest value of the plural reference states to obtain plural cell signals to determine respective logic states of the plural cells.

18. A method according to claim 17, wherein the plural reference states are respective plural bitline voltages.

19. A method according to claim 17 further comprising:
comparing respective cell resistances of the plural unmarked cells with a current reference state selected from the plural reference states, wherein the selection of the current reference state starts with a lowest value of the plural reference states;
if a specific one of the plural cells has a cell resistance smaller than the current reference state, marking the corresponding one of the plural cells as a marked cell;
if all the plural cells are sensed as having the respective cell resistances lower than that of the current reference state, then stopping the method;
if a highest reference state is reached, marking the remaining unmarked plural cells with a higher resistance; and
if the highest reference state is not reached, moving the current reference state to a reference state of a least higher value and then going to the sensing step, wherein the respective marked cells are not going to be pre-charged or sensed during a next sensing step for preventing a disturbance.

20. A method according to claim 19, wherein the plural reference states are corresponding to plural reference resistances, a specific one of the plural reference states with the lowest value has a lowest reference resistance, and a second specific one of the plural reference states with the highest value has a highest reference resistance.

* * * * *